(12) United States Patent
Crawford

(10) Patent No.: US 6,898,227 B2
(45) Date of Patent: May 24, 2005

(54) SEMICONDUCTOR LASER WITH A TAPERED RIDGE

(75) Inventor: Devin Crawford, St. Paul, MN (US)

(73) Assignee: ADC Telecommunications, Inc., Eden Praire, MN (US)

( * ) Notice: Subject to any disclaimer, the term of this patent is extended or adjusted under 35 U.S.C. 154(b) by 536 days.

(21) Appl. No.: 10/020,644

(22) Filed: Dec. 14, 2001

(65) Prior Publication Data

US 2003/0112842 A1 Jun. 19, 2003

(51) Int. Cl.[7] .................................................. H01S 5/00
(52) U.S. Cl. ........................................ 372/46; 372/45
(58) Field of Search .............................. 372/45, 46, 48, 372/49, 50, 43

(56) References Cited

U.S. PATENT DOCUMENTS 5,663,976 A * 9/1997 Razeghi ........................ 372/46
6,278,720 B1 * 8/2001 Lee et al. ..................... 372/46
6,304,587 B1 * 10/2001 Zah .............................. 372/46
6,375,364 B1 * 4/2002 Wu .............................. 385/88

* cited by examiner

Primary Examiner—Don Wong
Assistant Examiner—Jimmy T Vu
(74) Attorney, Agent, or Firm—Schwegman, Lundberg, Woessner & Kluth, P.A.

(57) ABSTRACT

A semiconductor ridge laser with a tapered ridge is disclosed. The tapered ridge is designed to provide for both gain-medium amplification and mode conversion amplification, the latter resulting in a higher kink power than is obtainable with gain medium amplification alone. The power and lateral mode content of the output beam is determined by the ridge parameters, which include length, width, number of sections and degree and type of taper for the tapered sections. The output beam can be made to have a profile that is more compatible with the lateral modes on an optical fiber than a conventional highly astigmatic output beam by including power in the higher-order lateral modes as well as in the fundamental lateral mode.

20 Claims, 8 Drawing Sheets

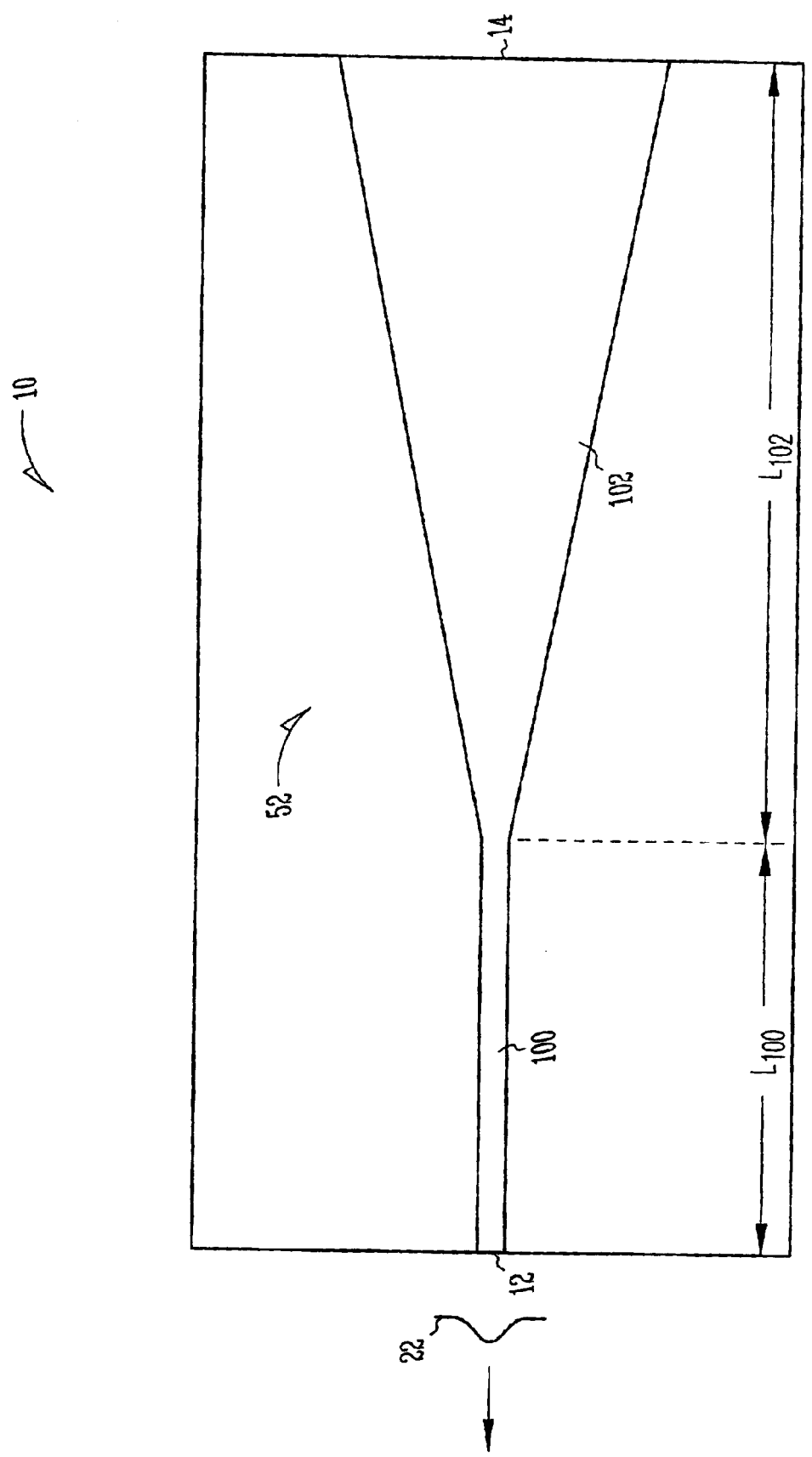

US 6,898,227 B2

SEMICONDUCTOR LASER WITH A TAPERED RIDGE

FIELD OF THE INVENTION

The present invention relates to semiconductor lasers, and in particular to high-power semiconductor ridge lasers.

BACKGROUND OF THE INVENTION

Many modern-day optical systems, including optical communication systems, utilize semiconductor lasers in combination with optical fibers. Optical coupling between the laser and the fiber is usually accomplished by an intervening optical system (e.g., a lens) or by placing an end of the fiber immediately adjacent the output end of the semiconductor laser.

Unfortunately, the coupling efficiency between a typical semiconductor laser and an optical fiber tends to be poor because light emitted from a semiconductor laser has an elliptical or astigmatic cross-section due to the asymmetric waveguide structure of the laser. An optical fiber, on the other hand, has a symmetric waveguide structure and so has a symmetrical acceptance (solid) angle. Further, for single-mode fiber, the acceptance angle is small, typically only a few degrees.

Stated in different terms, the waveguide modes of the optical fiber are symmetric while the waveguide modes of a typical diode laser are asymmetric, and this mode mismatch results in coupling loss. The mode mismatch is even greater when the laser lases in multiple lateral modes and the optical fiber supports only a single lateral mode. It is therefore desirable to have the semiconductor laser lase in a manner that allows for efficient coupling into an optical fiber.

Semiconductor ridge lasers, which are known for their high output power, are often employed in applications involving single mode optical fiber. Efficient light coupling from a semiconductor ridge laser into a single mode optical fiber is facilitated by making the output beam profile from the ridge laser as symmetric as possible. Further, the laser preferably lases in a single lateral mode that matches, to the extent possible, the lateral mode of the fiber (which for most single mode fibers is described by a Bessel function).

To obtain a high output power from the semiconductor laser, a high injection current is required. However, there is a beam-steering effect associated with high injection current that causes the output beam to diverge. This effect is commonly called "kink" because it manifests itself as a kink in the optical power v. injection current characteristic curve (often referred to as an "L-I" curve) of the semiconductor laser. The kink in the L-I curve and the associated output light divergence is due to the interaction between the first and fundamental lateral modes of the semiconductor laser, and the fact that the lateral mode structure in the laser is a function of the refractive index of the waveguiding structure.

At low injection current, the laser typically operates in the fundamental (i.e., zeroeth order) lateral mode, and the refractive index of the ridge waveguide remains constant. However, at a high injection current, the mode structure becomes unstable due to ohmic heating and spatial hole burning. These changes allow the first order lateral mode to propagate and resonate with the fundamental lateral mode, which causes kink. As the first order lateral mode has a higher divergence angle than the fundamental mode, it does not couple into a single-mode optical fiber as efficiently.

The prior art includes techniques for altering the shape of the output beam of a semiconductor ridge laser by providing a taper at the output end of the ridge. For example, U.S. Pat. Nos. 6,052,397 and 6,174,748 B1 disclose a laterally and vertically tapered ridge structure that transforms a highly elliptical mode profile in an active gain section of a semiconductor ridge laser into a substantially circular mode profile in a passive waveguide section of the device. However, a shortcoming of this type of device is that the passive waveguide section supports multiple higher-order lateral modes that in the output beam diverge significantly with respect to the fundamental mode. Thus, the coupling efficiency between the semiconductor laser and the fiber is not optimized. Also, the portion of the laser associated with the tapered ridge section is passive, so that it does not contribute to increasing the output power of the laser.

Other related prior art devices provide for amplification of the output light in a tapered end of the ridge. An example of such a device is a master oscillator power amplifier (MOPA). In a MOPA device, the tapered region is an active gain medium, so that the light is amplified over a larger area of the taper. Further, the tapered output facet is antireflection coated so that only amplification and not lasing occurs in the tapered section. While a MOPA device provides a higher output power by virtue of the amplification in the tapered end, the tapered end also supports multiple higher-order lateral modes, which as mentioned above, can create a higher output divergence resulting in reduced coupling efficiency.

SUMMARY OF THE INVENTION

A semiconductor ridge laser having a ridge that includes one or more tapered sections is disclosed. In one embodiment, the one or more tapered sections are designed to facilitate the conversion of energy from higher-order lateral modes into the fundamental mode to increase the output power. In another embodiment, the one or more tapered sections facilitate control over higher-order lateral modes, which can be made to tailor the shape of the output beam via superposition, and make it more symmetric than a purely fundamental mode output beam.

Sections of the ridge are designed to support higher-order lateral modes that acquire gain from a larger portion of the active region of the waveguiding structure than is possible with just the fundamental mode. The amplification of the lower-order spatial modes (e.g., the fundamental mode) is accomplished in two ways: by direct propagation of the spatial modes through the active region, and by optical pumping from the higher order modes, which converts energy from the higher-order lateral modes to the fundamental mode. This is termed herein "mode conversion amplification." The result is increased output power (i.e., a higher kink power) without having to lengthen the laser cavity. The profile of the output beam can also be tailored by adjusting the ridge parameters to provide a superposition of the fundamental lateral mode and higher order modes to make the output more symmetric, resulting in improved coupling to an optical fiber.

BRIEF DESCRIPTION OF THE DRAWINGS

FIG. 7 is a plan view of a tapered semiconductor ridge laser showing a first substantially uniform-width output section and a contiguous tapered section located adjacent the back end of the laser.

DETAILED DESCRIPTION OF THE INVENTION

Figure 1:
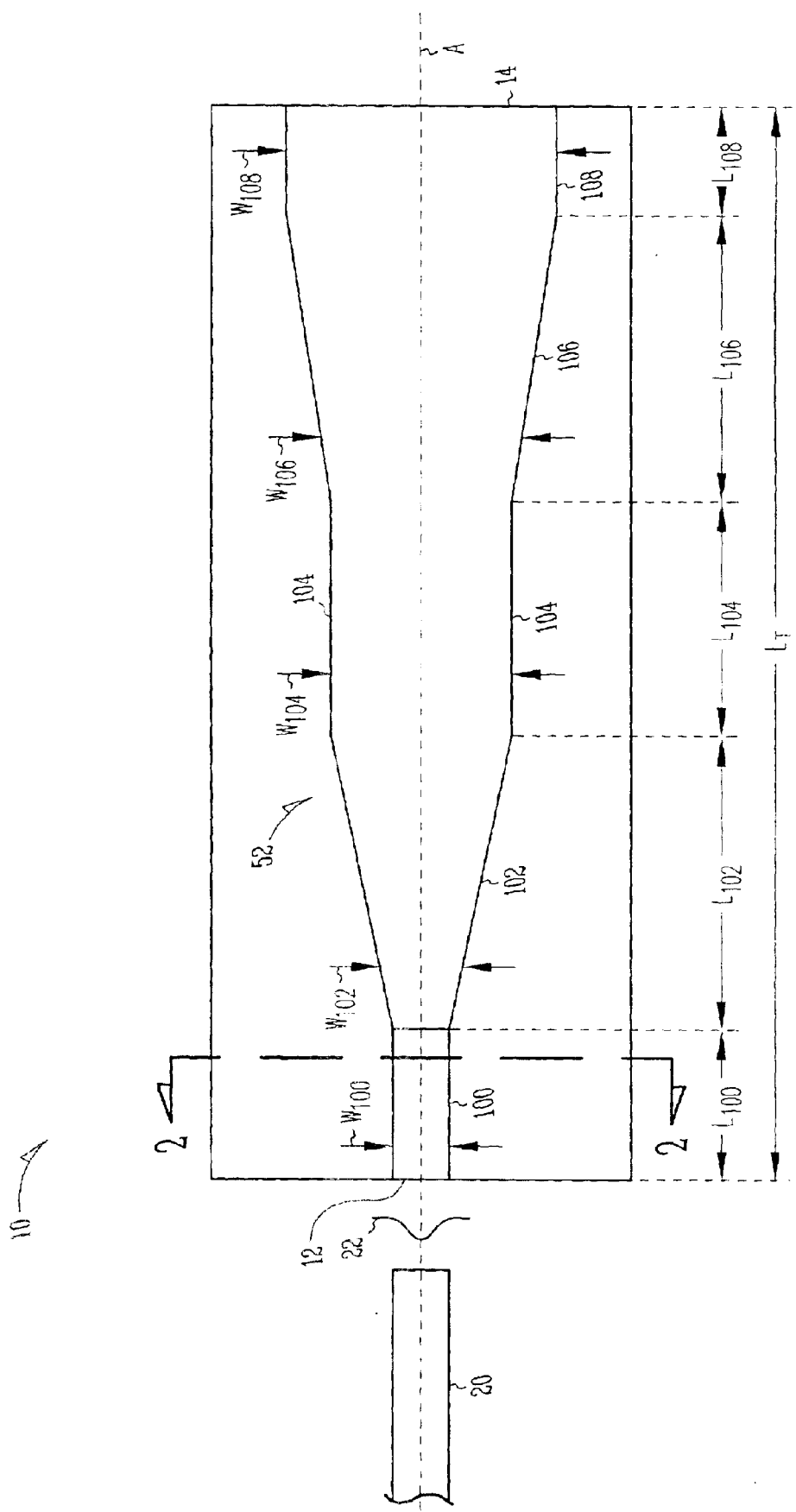
FIG. 1 is a plan view of a generalized semiconductor ridge laser with five different sections, including two tapered sections, and showing an optical fiber coupled to the output end of the laser.
Figure 2:
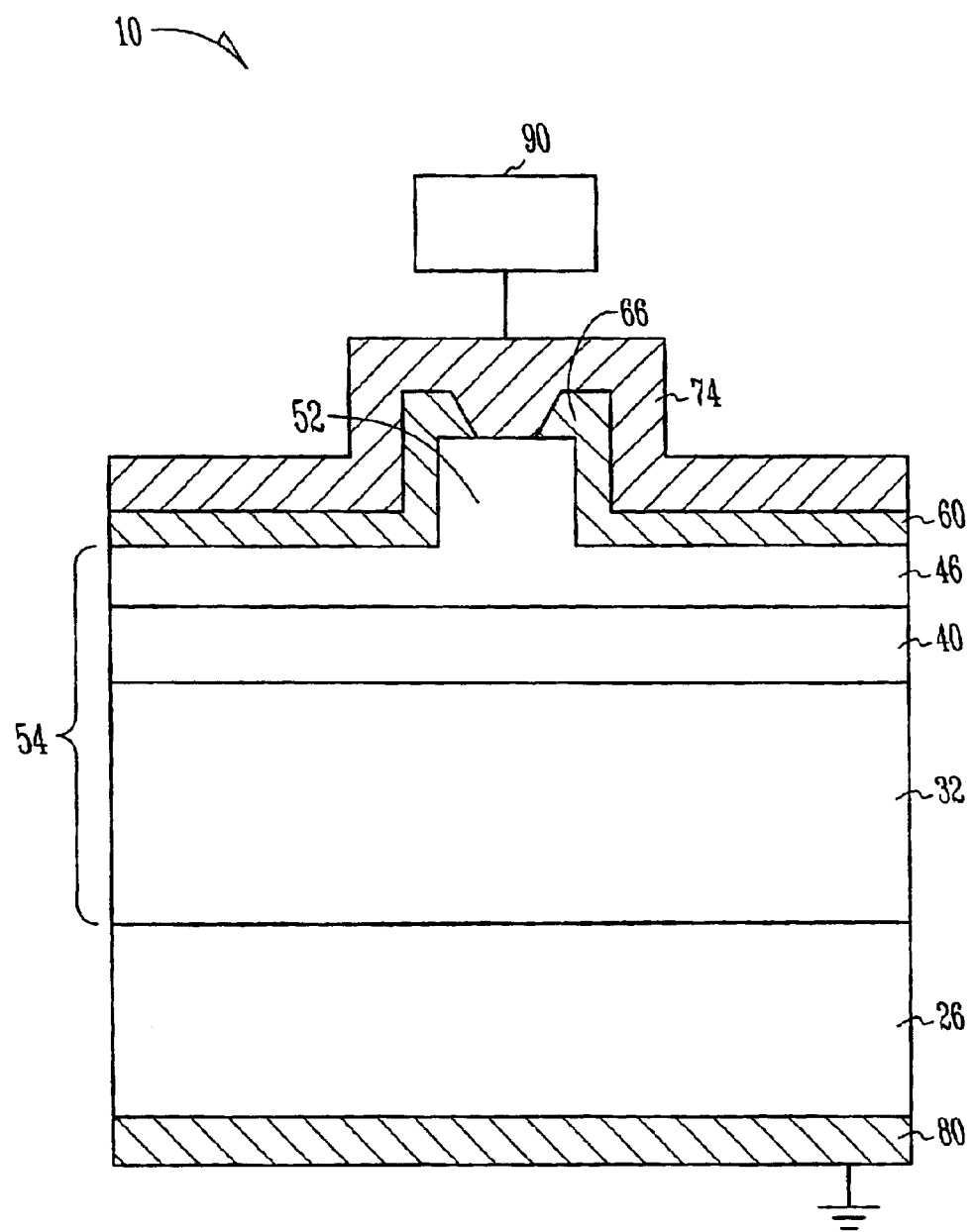
FIG. 2 is a cross-sectional view of the laser of FIG. 1 taken along the line 2—2, additionally showing the two metal contacts and the injection current source for pumping the active layer.

With reference now to FIGS. 1 and 2, there is shown a semiconductor ridge laser 10 having an output end 12, a back end 14 and a long axis A. Output end 12 is preferably coated with an anti-reflection coating, while back end 14 is preferably coated with a high-reflection coating. FIG. 1 illustrates a generalized embodiment of laser 10 optically coupled to an optical fiber 20, which in an exemplary embodiment is a single mode fiber. Laser 10 is capable of emitting an output beam 22 from output end 12.

Ridge Laser Structure

Except for the form of the ridge, as discussed in detail below, laser 10 has a standard semiconductor ridge laser structure. Accordingly, laser 10 may be formed using standard photolithography techniques (e.g., masking, exposing, developing and etching), and various epitaxial growth techniques used in the art for fabricating semiconductor lasers, such as liquid phase epitaxy (LPE), molecular beam epitaxy (MBE) or metal-organic chemical vapor deposition (MOCVD). Two exemplary material families for making up laser 10 are the InGaAsP/InP family and the GaAs/AlGaAs family.

With reference to FIG. 2, laser 10 includes a substrate 26, which may be, for example a suitable n-doped semiconductor (e.g., GaAs or InP). Upon substrate 26 is formed a lower cladding layer 32, which may comprise, for example, n-InP, n-AlGaAs, or n-InGaAsP Atop lower cladding layer 32 is formed an active layer 40, which may comprise, for example, InGaAs, InGaAsP or AlGaAs. Active layer 40 may comprise a single active layer or quantum well layer, or a plurality of quantum well layers separated by barrier layers. Active layer 40 thus constitutes a gain medium capable of guiding light and serves to provide gain (i.e., amplification) to light propagating therethrough once the layer is pumped with an injection current.

Formed atop active layer 40 is an upper cladding layer 46, which may comprise, for example, p-InP or p-AlGaAs or p-InGaAsP. Upper cladding layer 46 is then processed (e.g., using photolithography techniques) to form a mesa or "ridge" 52. Ridge 52 characterizes a semiconductor ridge laser (also known as a "ridge waveguide laser" or "RWG laser"). Ridge 52, active layer 40, and lower cladding layer 32 constitute a waveguiding structure 54 capable of guiding and amplifying light confined therein to produce laser output beam 22.

In the discussion below, ridge 52 is referred to as supporting various lateral spatial modes (hereinafter, simply "lateral modes"). Technically speaking, it is the entire waveguiding structure 54 that supports the lateral modes, with the width of ridge 52 dictating the lateral extent of the optical confinement within waveguiding structure 54 and thus the number of lateral modes propagating. Upper cladding layer 46 covers active layer 40. As such, ridge 52 is said to be an "active ridge" in that light propagating in waveguide structure 54 experiences gain due to a portion of the light being guided within active layer 40.

With continuing reference to FIG. 2, laser 10 further includes an insulating layer 60, such as an oxide (e.g., $SiO_2$) or $Si_3N_4$, formed atop upper cladding layer 46 and covering all but a portion of ridge 52 so as to provide a contact opening 66. A metal contact layer 74 is then formed atop insulating layer 60 to provide electrical contact to ridge 52 via contact opening 66. Contact opening 66 fills with metal when metal contact layer 74 is formed, so that the metal makes contact with ridge 52. This allows for an injection current to be provided to laser 10 via an injection current source 90 electrically connected to contact layer 74. Further, a metal contact layer 92, preferably connected to ground, is formed adjacent substrate 26 on the side opposite first cladding layer 32 to complete the electrical circuit. Current source 90 provides the injection current necessary to pump active layer 40 so that lasing can occur.

The Tapered Ridge

With reference again to FIG. 1, in a generalized embodiment of laser 10, upper cladding layer 46 is processed to form a ridge 52 that includes a plurality of contiguous sections. Specifically, ridge 52 includes at least two sections 100 and 104 that are interconnected by a third section 102. The first and second sections have different widths at their respective points of interconnection with the third section of the ridge. Third section 102 is thus tapered, and the taper may be linear or curved.

In one particular embodiment shown in FIG. 1, ridge 52 has a total length $L_T$ and a number (e.g., five) of contiguous sections 100, 102, 104, 106, and 108 having corresponding lengths $L_{100}$, $L_{102}$, $L_{104}$, $L_{106}$ and $L_{108}$ and corresponding widths $W_{100}$, $W_{102}$, $W_{104}$, $W_{106}$ and $W_{108}$. In this example embodiment, widths $W_{100}$, $W_{104}$, and $W_{108}$ are substantially constant, which can have, for example, increasing width from output end 12 to back end 14. Widths $W_{102}$ and $W_{106}$, on the other hand, vary as a function of the axial distance (i.e., are tapered) in order to connect their respective adjoining sections. In one example embodiment, widths $W_{100}$, $W_{104}$ and $W_{108}$ are selected to support an increasing number of lateral modes in respective sections 100, 104 and 108. By way of example, width $W_{100}$ may be such that only a single mode is supported in section 100, while width $W_{104}$ may be such that two or three modes are supported in section 104, and width $W_{108}$ maybe such that four or more modes are supported in section 108.

In an example embodiment, the degree of taper in the one or more tapered sections (e.g., sections 102 and 106) is such that the reduction in the number of lateral modes due to light encountering the tapered section occurs adiabatically. Thus, the taper of sections 102 and 106, for example, is preferably gradual (e.g., a slope of 0.01 for a linear taper) so that the conversion of one or more higher-order lateral modes into one or more lower-order lateral modes (e.g., the fundamental lateral mode) is accomplished gradually and with as little loss of energy as possible.

In the generalized embodiment of FIG. 1, five ridge sections are shown for the sake of illustration. However, greater or fewer sections can be used. For example, with reference to FIG. 3, there is shown an example embodiment of semiconductor ridge laser 10 made up of the first three contiguous sections 100, 102 and 104 of laser 10 of FIG. 1. In addition, the shapes of the different sections of the ridge can be varied from those illustrated herein, and could include stepped sections, curved sections, or combinations of these or similar shapes.

Figure 4:
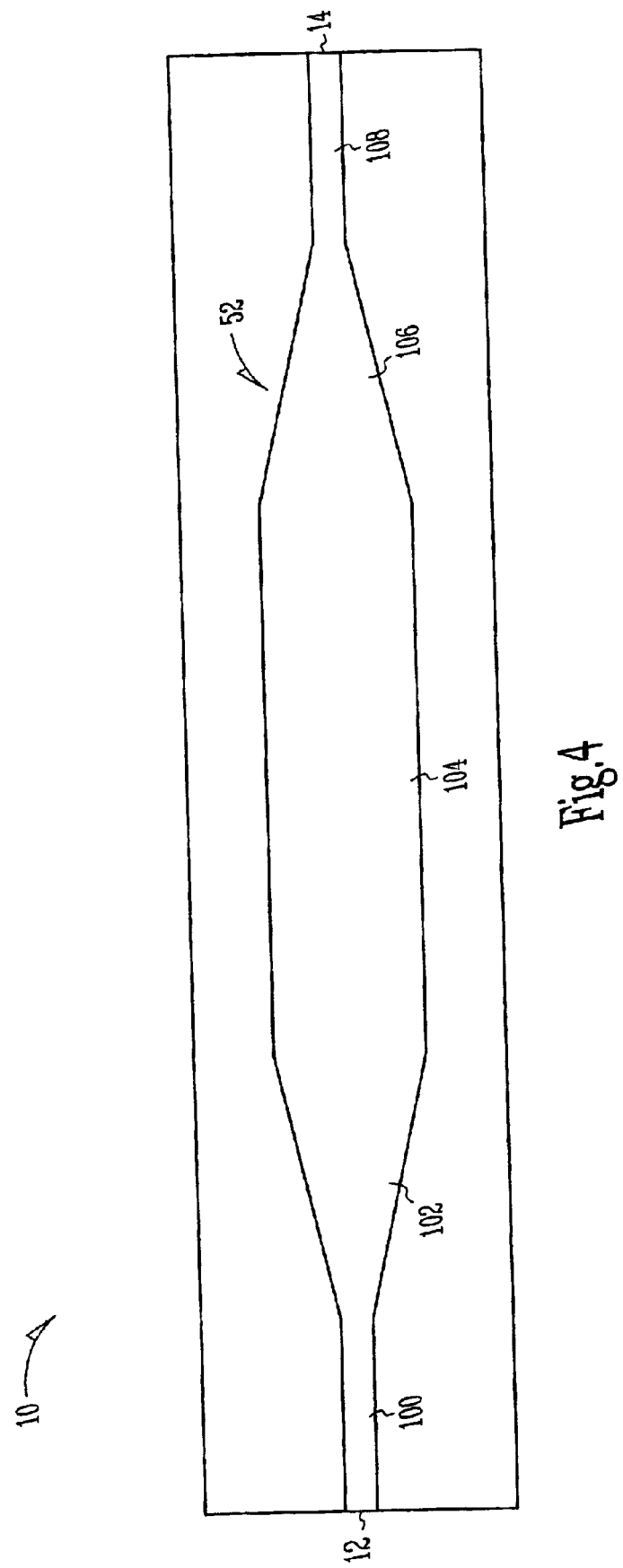
FIG. 4 is a plan view of one of the possible embodiments of the generalized semiconductor ridge laser of FIG. 1, wherein the widest ridge section is centrally located and connected to two narrow ridge sections by two tapered sections.

Further, in FIG. 4 there is shown an example embodiment of laser 10 having five contiguous sections that includes a widest central section 104 surrounded by two narrower sections 100 and 108 respectively connected to section 104 by tapered sections 102 and 106.

Generally, laser 10 includes two or more ridge sections 100, 102, etc., at least one of which is tapered (e.g., section 102) and capable of supporting lateral modes other than the fundamental mode along at least a portion of its length. Of the two or more ridge sections 100, 102, . . . , constituting ridge 52, it is preferred that the narrowest section be formed adjacent output end 12.

The wide ridge sections increase the volume of the optical confinement within waveguiding structure 54, which allows for additional amplification of the light propagating within active layer 40, resulting in increased output power on the order of hundreds of mW (e.g., greater than 100 mW). The additional amplification is due to waveguiding structure 54 supporting multiple higher-order lateral modes as well as a fundamental lateral mode.

Standard Gain Medium Amplification

Figure 5:
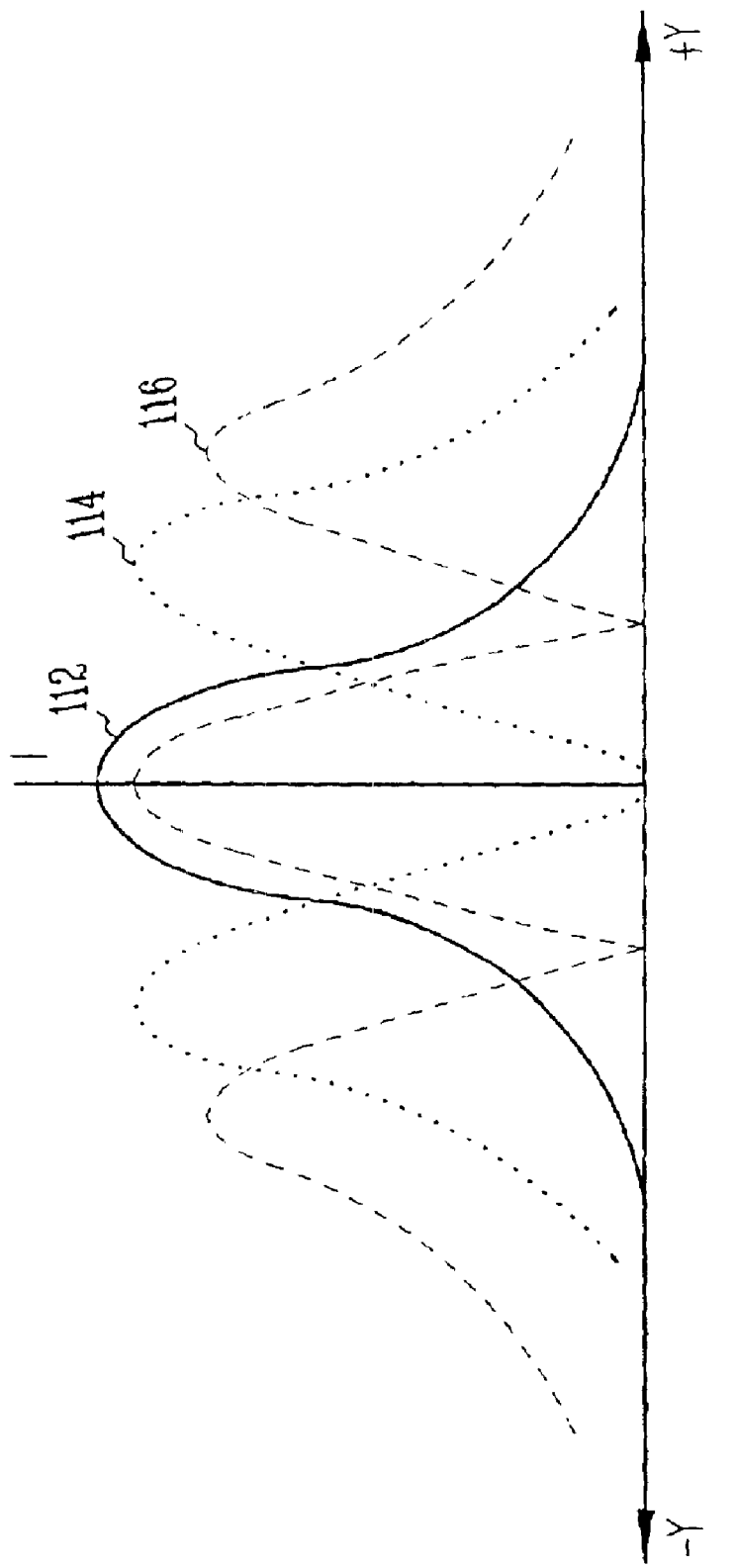
FIG. 5 is a plot of the spatial distribution in intensity (I) as a function of the lateral dimension of the waveguiding structure for the fundamental, first and second order lateral modes of the tapered ridge laser, wherein y=0 represents the on-axis position.

FIG. 5 plots the spatial distribution in intensity (I) as a function of the lateral dimension for a fundamental lateral mode 112, first- and second-order lateral modes 114 and 116 of the laser 10, wherein y=0 represents the on-axis position.

In laser 10, fundamental lateral mode 112 (FIG. 5) is amplified two different ways. The first way is the standard amplification acquired from the gain medium itself as the light propagates within waveguiding structure 54. First- and second-order lateral modes 114 and 116 are higher-order lateral modes that have a greater spatial extent than fundamental lateral mode 112. Thus, whereas fundamental lateral mode 112 acquires its gain close to axis A, the higher-order lateral modes 114 and 116 acquire gain in the portion of active layer 40 farther away from axis A. Providing ridge 52 with relatively wide sections allows for multiple lateral modes (e.g., modes 112, 114 and 116) to be supported in waveguiding structure 54. This, in turn, allows for more of the gain region to be utilized, ultimately resulting in more output power.

Mode Conversion Amplification

Fundamental spatial mode 112 is also amplified a second way by the conversion of energy from the higher-order lateral modes (e.g., modes 114 and 116) as the light propagates in ridge 52 toward output end 12. This amplification results from absorption of optical power in the single-mode section 100 that was generated in the wide section 104. Absorption occurs in regions where there is no current injection (e.g. away from the ridge) that are generally lossy.

More generally, the fundamental mode 112 is amplified by the conversion of energy from higher-order modes (e.g., mode 116).

This second type of amplification, referred to herein as "mode conversion amplification," is facilitated by the tapered sections (e.g., sections 102 and 106 of FIG. 1) in ridge 52. The tapered sections of ridge 52 are designed to alter the waveguiding properties of the laser to cause mode conversion of the light propagating therein. The change in modal properties of the ridge 52 that occurs in tapered section 102 can also cause reflection of the higher order modes. This fact can be used advantageously to tailor the output beam 22, as discussed below.

Figure 6B:
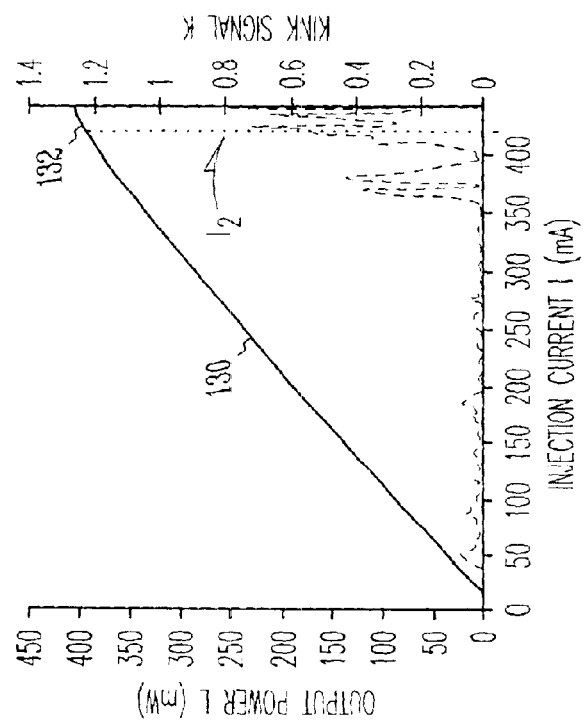
FIG. 6B is the same plot as FIG. 6A, but with the uniform ridge replaced with the tapered ridge of the present invention, illustrating a higher kink current than that for the conventional semiconductor ridge laser.
Figure 6A:
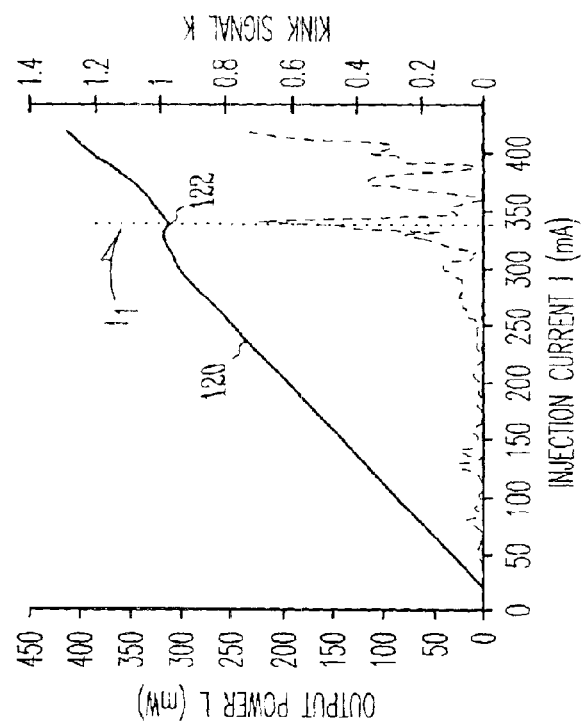
FIG. 6A is a plot of the output power (L) and the kink signal (K) versus the injection current I for a conventional semiconductor ridge laser with a uniform ridge.

FIG. 6A plots the "L-I" curve of output power L as a solid line (left-hand vertical axis) versus injection current I for a conventional semiconductor ridge laser. Also plotted is the kink signal K (right-hand vertical axis) as a dashed line. Curve 120 of FIG. 6A is the typical output power curve associated with a uniformly wide ridge 52. A kink 122 in the output power L occurs at a first injection current value I1 of about 335 mA. As mentioned above, it is generally well accepted that the kink 122 in the L-I curve results from an interaction between the first and fundamental lateral modes.

In laser 10, the mode conversion amplification process is used to solve the problem of kink-limited output power associated with conventional semiconductor ridge lasers. Thus, with reference again to laser 10 of FIG. 4, at low drive currents, wide section 104, which is capable of supporting multiple lateral modes, acts as a gain region for the fundamental lateral mode. However, section 104 has a lower series resistance than narrower sections 100 and 108 due to its relatively larger width and hence larger contact area. Consequently, the ohmic heating associated with section 104 tends to be reduced relative to the narrower sections 100 and 108.

At high drive-current levels, the round trip gain for the second-order lateral mode 116 in section 104 may reach threshold, and consequently some of the carriers injected into this region are converted into optical power in the second-order lateral mode. Once this occurs, the second-order lateral mode lases within the cavity defined by section 104 and tapered sections 102 and 106. Lasing of the first-order mode is inhibited by the even symmetry of the ridge about the axis A. Tapered sections act as lossy "mirrors" for the second-order mode to the extent that this mode is absorbed in the unpumped regions beyond the tapered sections.

FIG. 6B is the same plot as FIG. 6A, but wherein curve 130 is the output power curve 130 for a laser 10 similar to the conventional ridge laser used to form curve 120 of FIG. 6A, except for the tapered ridge. A kink 132 in curve 120 occurs at a second injection current value I2 of about 425 mA, significantly greater than I1.

Example Embodiments

Table 1 below provides example dimensions of the above-described parameters for an example of the semiconductor ridge laser 10 illustrated in FIG. 1.

TABLE 1

Example parameters for a five-section tapered ridge laser

| PARAMETER | DIMENSION (microns) |
|---|---|
| $L_T$ | 750 |
| $L_{100}$ | 50 |
| $L_{102}$ | 150 |
| $L_{104}$ | 250 |
| $L_{106}$ | 200 |
| $L_{108}$ | 100 |
| $W_{100}$ | 5 |
| $W_{102}$ | Slope = 1/100 |
| $W_{104}$ | 8 |
| $W_{106}$ | Slope = 1/100 |
| $W_{108}$ | 12 |

In an alternative example embodiment, the width $W_{100}$ of section 100 is greater than 2 microns and less than 10 microns.

With reference to FIG. 7, in an example embodiment ridge 52 of laser 10 includes only first ridge section 100 that supports either the fundamental lateral mode or the fundamental and first lateral modes. Further included is tapered ridge section 102 that supports multiple lateral modes, including the fundamental lateral mode. Lengths $L_{100}$ and $L_{102}$ are selected to optimize the gain in tapered section 102 while still providing for mode conversion amplification of the fundamental lateral mode or alternatively the fundamental and second-order lateral modes that constitutes output beam 22.

Figure 8:
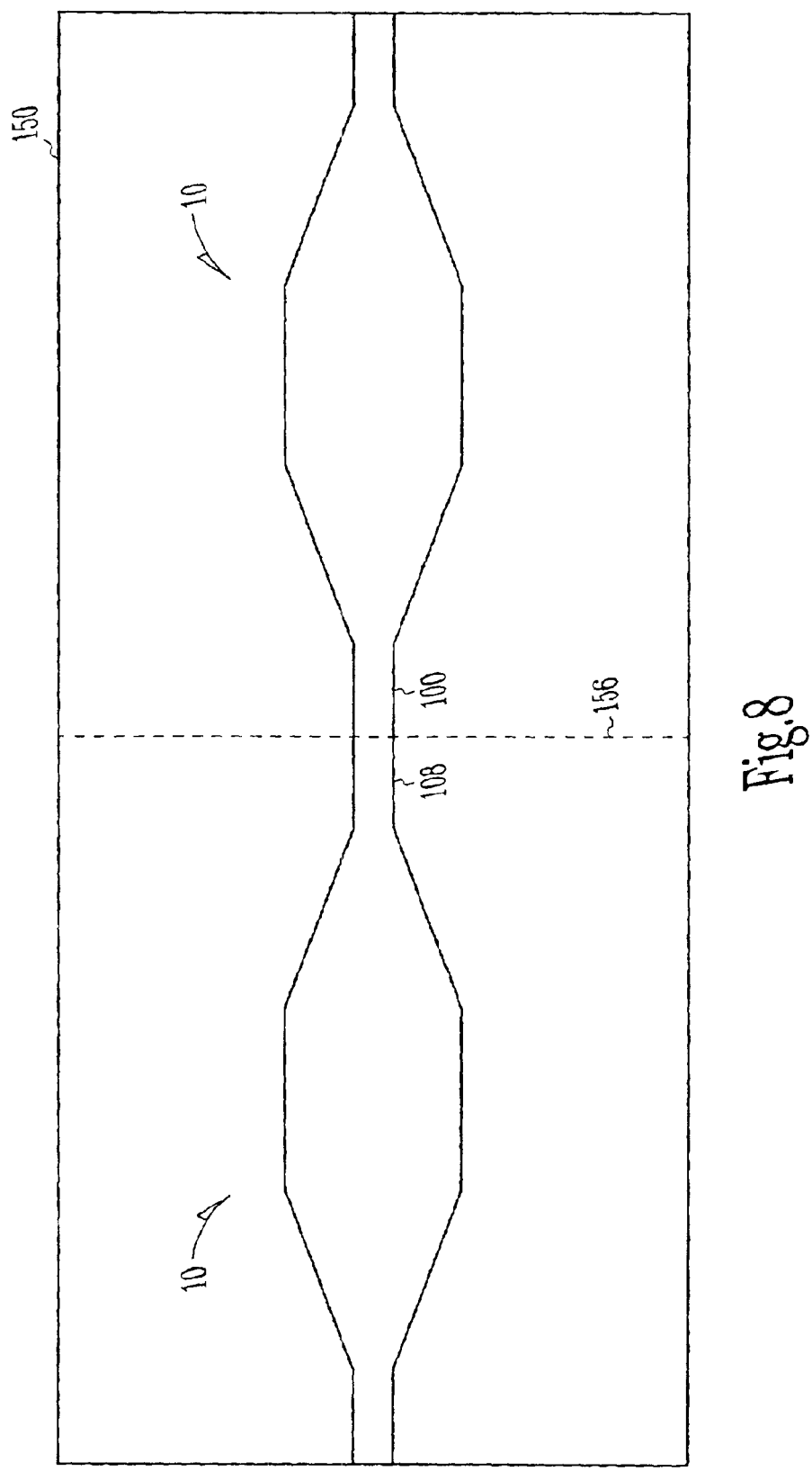
FIG. 8 is a plan view of a chip that includes two semiconductor ridge lasers according to FIG. 4 connected to one another to illustrate the desirability of the design of the laser of FIG. 4 from a manufacturing viewpoint.

With reference to FIG. 8, the geometry of laser 10 illustrated in FIG. 4 is desirable from a manufacturing viewpoint. In FIG. 8, two lasers 10 of the type shown in FIG. 4 are formed on a single chip 150, with section 100 of one laser joining section 108 of the other laser. Alternatively, sections 100 of the respective lasers can be joined. Chip 150 can then be diced in half (e.g., along dashed line 156) to separate the two lasers.

Figure 3:
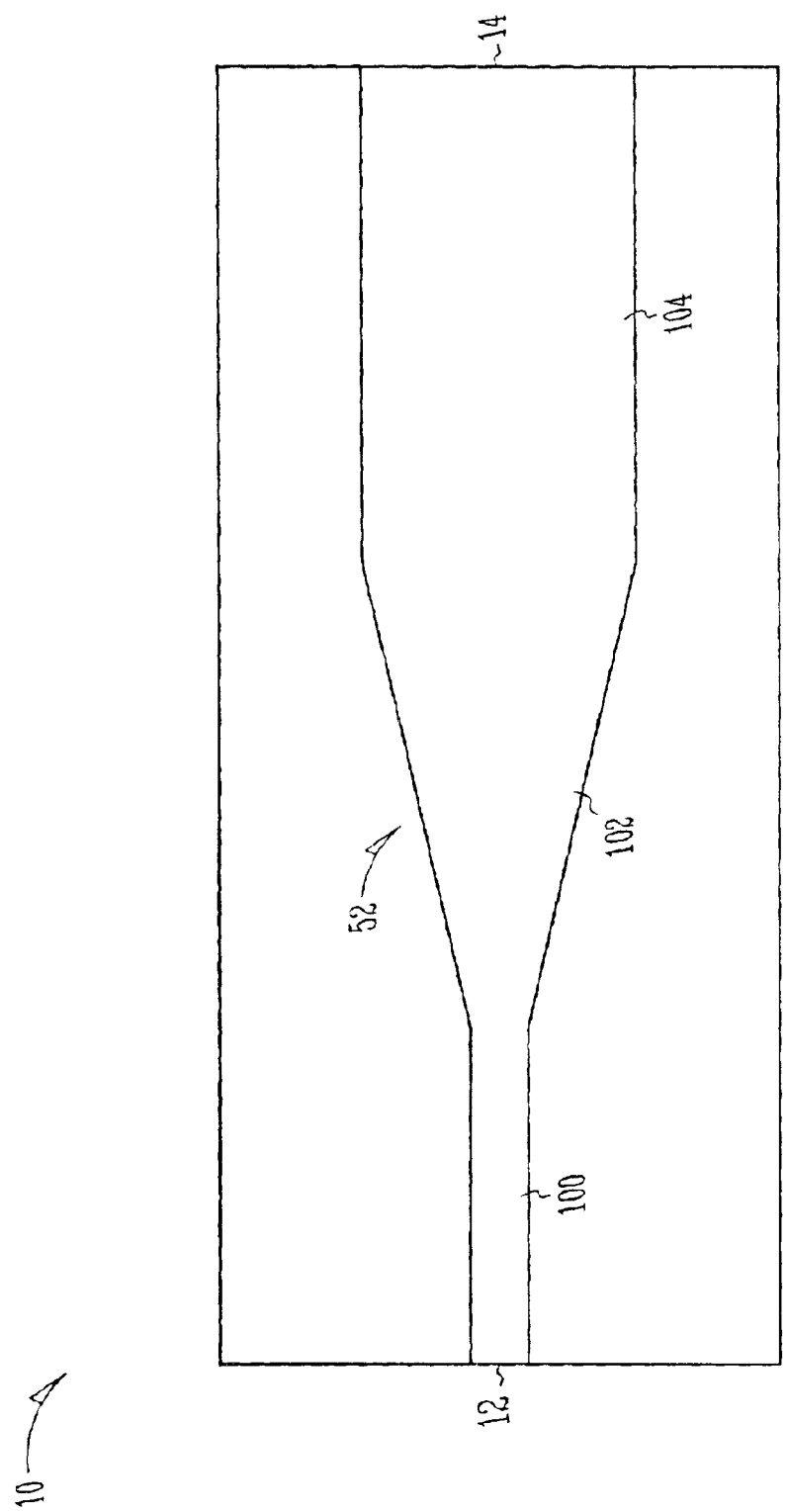
FIG. 3 is a plan view of an example embodiment of the generalized semiconductor ridge laser of FIG. 1 that includes only the first three ridge sections of the laser of FIG. 1.

In another example embodiment, laser 10 of FIG. 4 can be diced in half to create two of the three-sectioned lasers 10 of FIG. 3.

Tailoring the Output Beam

In one embodiment of semiconductor ridge laser 10, output section 100 of ridge 52 is single mode so that output beam 22 is also single mode. However, while a single-mode output beam can provide high power from mode conversion amplification, it tends to be highly elliptical. Ideally, output beam 22 has a power distribution that exactly matches the spatial mode or modes supported by optical fiber 26, which are typically circularly symmetric. It may therefore be desirable to allow a portion of the output beam energy to reside in higher-order spatial modes. Such a power distribution can provide a beam geometry (profile) that is more symmetric than a purely single-mode output beam, making for a better match to the spatial mode(s) of an optical fiber.

The power distribution between the second lateral mode and the fundamental mode depends on the geometry of ridge 52, as discussed above. The parameters of ridge 52 (i.e., overall length, section lengths, degree of taper, etc.) can be selected to tailor the modal content of output beam 22 so that its profile better matches the spatial mode profile of optical fiber 26. The best combination of ridge parameters for tailoring the output beam for a given application can be arrived at empirically. In addition, modeling and simulating the propagation modes in the ridge waveguide structure of laser 10 for various ridge geometries can be conducted to arrive at suitable ridge parameters, or to provide a starting point for empirical study to determine the most desirable ridge parameters and the best operating characteristics of the laser.

While the present invention has been described in connection with preferred embodiments, it will be understood that it is not so limited. On the contrary, it is intended to cover all alternatives, modifications and equivalents as may be included within the spirit and scope of the invention as defined in the appended claims.

What is claimed is:

1. A semiconductor ridge laser apparatus comprising:
   a first cladding layer, an active layer, and a second cladding layer formed on a substrate;
   a ridge formed in the second cladding layer, the ridge having a first section with a first width and an output end, and capable of supporting a fundamental lateral mode;
   a second section having a second width different than the first width and capable of supporting the fundamental and higher-order lateral modes; and
   a third section connecting the first and second sections, the third section designed to facilitate mode conversion amplification, wherein at least a portion of energy in the higher-order lateral modes is converted to energy in the fundamental mode.

2. The apparatus of claim 1, wherein the third section has a linear taper.

3. The apparatus of claim 1, wherein the first section has a substantially uniform width.

4. The apparatus of claim 3, wherein the second section has a substantially uniform width.

5. The apparatus of claim 1, wherein the first section supports a second-order mode, and wherein the mode conversion converts energy from the higher-order lateral modes to the fundamental and second-order lateral modes.

6. The apparatus of claim 5, further including an optical fiber optically coupled to the output end.

7. The apparatus of claim 1, further including:
   a first metal contact formed atop the ridge so as to provide an electrical connection to the ridge; and
   a second metal contact formed adjacent the substrate opposite the first cladding layer so as to provide electrical contact to the substrate.

8. The apparatus of claim 7, further including:
   an injection current source electrically connected to the first metal contact for providing an injection current for pumping the active layer.

9. The apparatus of claim 1, wherein the active layer is one of InGaAs, InGaAsP and AlGaAs.

10. The apparatus of claim 1, wherein the first and second cladding layers are one of InP and AlGaAs, and InGaAsP.

11. The apparatus of claim 1, wherein the first section has width greater than 2 microns and less than 10 microns.

12. The apparatus of claim 1, wherein the first section has a length of about 50 microns and a width of about 5 microns.

13. The apparatus of claim 12, wherein the tapered third section has a length of about 150 microns and wherein the taper has a slope of about 0.01.

14. The apparatus of claim 13, wherein the second section has a length of about 250 microns.

15. A semiconductor ridge laser apparatus, comprising:
   a first active ridge section having a first width formed at an output end of the laser and capable of supporting a fundamental lateral mode and one higher-order lateral mode;

a second active ridge section having a second width and capable of supporting the fundamental lateral mode and a first number of higher-order lateral modes; and a third active ridge section connecting the first and second active ridge sections and designed to facilitate mode conversion amplification of the fundamental and one higher-order lateral mode in the first active ridge section; and wherein the fundamental lateral mode and the one higher-order lateral mode form an output beam having a profile that is less astigmatic than a purely fundamental lateral mode output beam profile.

16. The apparatus of claim 15, wherein the third active ridge section has a linear taper.

17. The apparatus of claim 15, wherein the one higher-order lateral mode is a second-order mode.

18. The apparatus of claim 15, further including:

a fourth active ridge section capable of supporting the fundamental mode and a second number of higher-order lateral modes greater than the first number of higher-order lateral modes; and a fifth active ridge section connecting the second and fourth active sections, the fifth active section designed to facilitate mode conversion amplification of energy in the second number of higher-order modes to energy in the fundamental mode and the first number of higher-order modes.

19. The apparatus of claim 18, wherein at least one of the third and fifth active ridge sections has a linear taper.

20. The apparatus of claim 15, wherein the output beam has a power greater than 100 mW.

* * * * *